United States Patent
Kim et al.

(10) Patent No.: US 6,590,951 B1
(45) Date of Patent: Jul. 8, 2003

(54) ADDRESS GENERATOR AND ADDRESS GENERATING METHOD FOR USE IN A TURBO INTERLEAVER/DEINTERLEAVER

(75) Inventors: Min-Goo Kim, Suwon-shi (KR); Beong-Jo Kim, Songnam-shi (KR); Young-Hwan Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/541,774

(22) Filed: Apr. 3, 2000

(30) Foreign Application Priority Data

Apr. 2, 1999 (KR) .............................................. 99-12859

(51) Int. Cl.[7] .............................................. H04L 23/00
(52) U.S. Cl. .................................. 375/377; 714/702
(58) Field of Search ................................ 375/377, 341; 714/701, 702

(56) References Cited

U.S. PATENT DOCUMENTS

| | | | |
|---|---|---|---|
| 5,446,747 A | 8/1995 | Berrou | 371/45 |
| 6,353,900 B1 * | 3/2002 | Sindhushayana et al. | 714/701 |
| 6,434,203 B1 * | 8/2002 | Halter | 375/341 |

FOREIGN PATENT DOCUMENTS

| | | |
|---|---|---|
| JP | 7-212250 | 8/1995 |

OTHER PUBLICATIONS

Japanese Office Action dated Sep. 17, 2002 issued in a counterpart application, namely Appln. No. 2000-610134.

* cited by examiner

*Primary Examiner*—Don N. Vo
(74) *Attorney, Agent, or Firm*—Dilworth & Barrese, LLP (57) ABSTRACT

An address generator and an address generating method are described. In the address generator, a first counter counts a plurality of clock pulses, generates a first group count, which indicates one of the group addresses of an interleaver block, at each clock pulse, and generates a carry after counting a predetermined number of clock pulses. A second counter receives the carry from the first counter, counts the plurality of carries, and generates a position count indicating one of the position addresses in each group. If the group count is one of the unavailable group count values representative of unavailable groups, or the group count is one of partially unavailable group count values representative of groups having both available and unavailable position addresses and the first position count is one of unavailable position count values representative of unavailable position addresses, a controller controls the first and second counters not to output the first group count and the first position count. A bit reverser reverses the first count. An operating device subjects the group count and the position count to an LCS (Linear Congruential Sequence) recursion formula and generates result bits. A buffer stores an available address formed out of the reversed bits received from the bit reverser and the result bits received from the operating device.

12 Claims, 7 Drawing Sheets

ADDRESS GENERATOR AND ADDRESS GENERATING METHOD FOR USE IN A TURBO INTERLEAVER/DEINTERLEAVER

PRIORITY

This application claims priority to an application entitled "Address Generator and Address Generating Method for Use in Turbo Interleaver/Deinterleaver" filed in the Korean Industrial Property Office on Apr. 2, 1999 and assigned Serial No. 99-12859, the contents of which are hereby incorporated by reference.

BACKGROUND OF THE INVENTION

1. Field of the Invention

The present invention relates generally to a turbo interleaver/deinterleaver in a radio communications system, and in particular, to an address generator and an address generating method for use in turbo interleaving/deinterleaving.

2. Description of the Related Art

A turbo encoder (i.e., an encoder using turbo codes) can be used as an encoder for a radio communications system such as a satellite system, the ISDN (Integrated Services Digital Network), a digital cellular system, W-CDMA (Wideband-Code Division Multiple Access), and IMT-2000 (CDMA 2000). The turbo encoder includes an interleaver, which randomizes the input information to the turbo encoder. The interleaver is a significant factor in the performance of the turbo encoder because it improves the distance property of the codewords.

Figure 1:
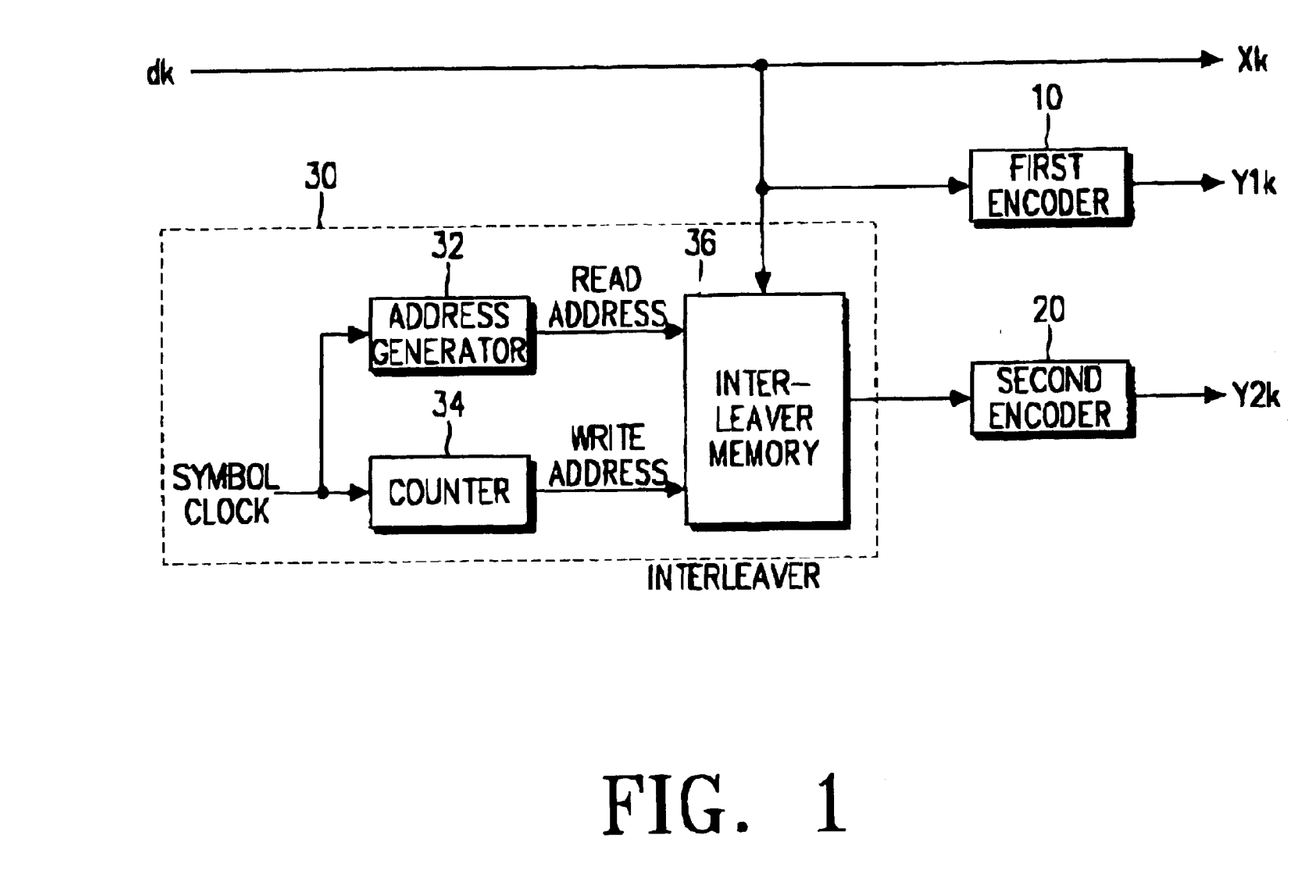
FIG. 1 is a block diagram of a typical turbo interleaver to which the present invention is applied.

FIG. 1 is a block diagram of a turbo encoder having a turbo interleaver to which the present invention is applied. For details, see U.S. Pat. No. 5,446,747 issued on Aug. 29, 1995.

In FIG. 1, the turbo encoder is comprised of a first constituent encoder 10 for encoding input frame data $d_k$ to $Y1_k$, an interleaver 30 for interleaving the input frame data $d_k$, and a second constituent encoder 20 for encoding the output of the interleaver 30 to $Y2_k$. For the input of $d_k$, the turbo encoder outputs $X_k$ without encoding, $Y1_k$ through encoding, and $Y2_k$ through interleaving and encoding. The first and second constituent encoders 10 and 20 can be RSC (Recursive Systematic Convolutional) encoders as are well-known in the field. The constituent encoders may vary in structure depending on their code rate.

The interleaver 30, having an interleaver size equal to the data frame length, permutes the sequence of input data bits, and outputs the permuted data bits to the second constituent encoder 20, thus reducing the correlation between the data bits.

The interleaver 30 includes an address generator 32, a counter 34, and an interleaver memory 36. The interleaver memory 36 stores the input frame data dk according to write addresses received from counter 34, and outputs the data according to read addresses received from the address generator 32. The address generator 32 generates a read address, which is used for reordering data bits, and feeds the read address to the interleaver memory 36. The read address is generated according to the length of an input data frame and a symbol clock signal. The counter 34 receives the symbol clock pulses and outputs the count value of the symbol clock pulses as a write address to the interleaver memory 36. The interleaver 30 outputs the data stored in the interleaver memory 36 to the second constituent encoder 20.

Various interleavers can be used as the inner interleaver for the turbo encoder, such as a PN (Pseudo Noise) random interleaver, a random interleaver, a block interleaver, a non-linear interleaver, or an S-random interleaver. These interleavers, however, use algorithms designed in an academic environment for the purpose of performance improvement, not algorithms designed from a practical perspective. These interleavers are often not viable because of the complexity of implementing them in hardware.

In the IMT-2000 specification and the IS-95C specification, a linear congruential sequence (LCS) turbo encoder constituted as shown in FIG. 1 has recently been settled as the turbo encoder. Specifically, it has been provided that turbo codes should be used for a supplemental channel, which is a data transmission channel in the air interface of IMT-2000 and IS-95C, and for a data channel in an UMTS (Universal Mobile Telecommunications System) developed by the ETSI (European Telecommunications Standards Institute).

Figure 2:
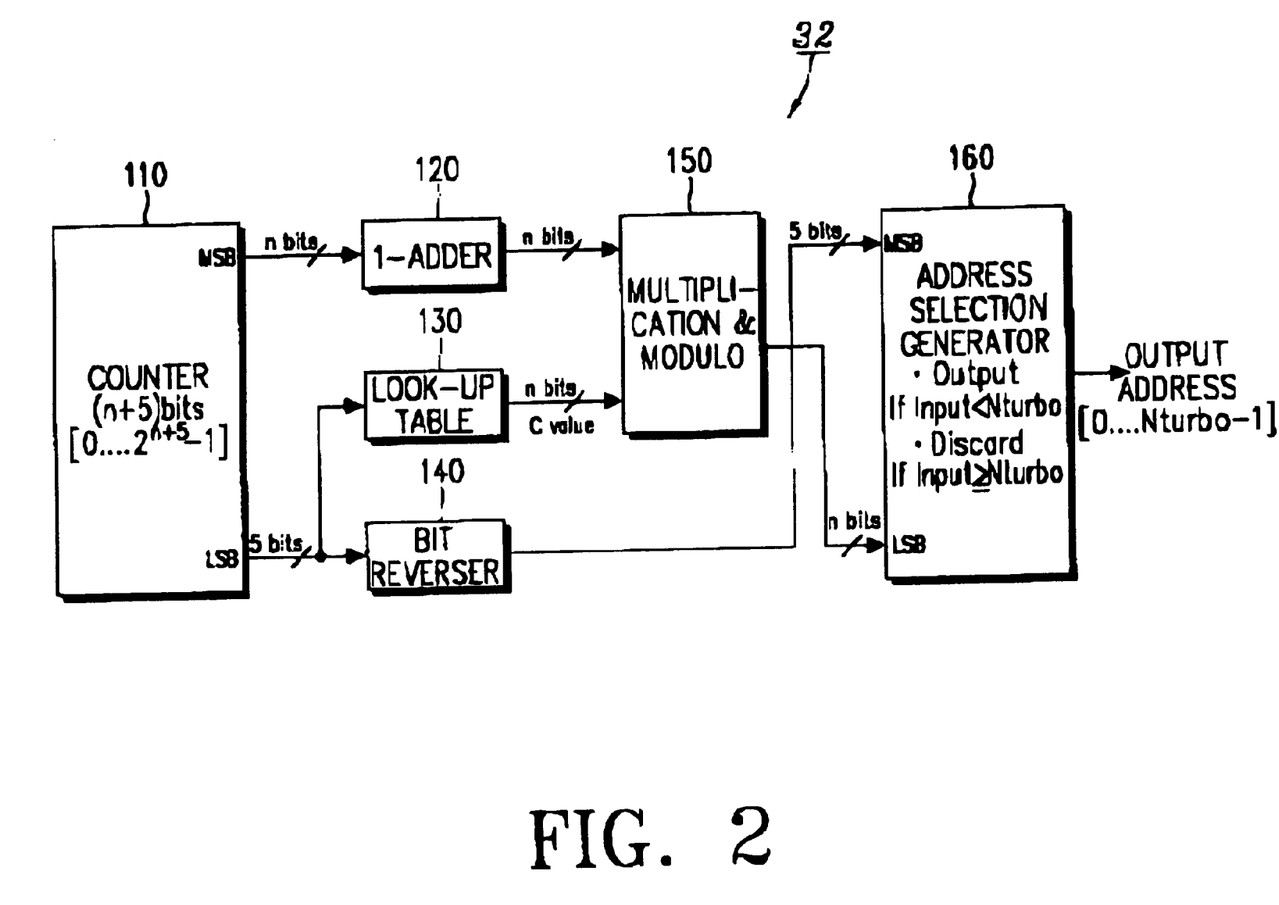
FIG. 2 is a block diagram of a conventional turbo interleaving address generator.

FIG. 2 is a block diagram of the address generator 32 shown in FIG. 1.

Referring to FIG. 2, the lower 5 bits, or the Least Significant Bits (LSBs), of the output from the input counter 110 are fed to a look-up table 130 for storing an initial seed (C-values) of each group and a bit reverser 140. The 5 lower bits indicate one of the $2^5$ groups of the interleaving block, which is determined according to the interleaver size. The bit reverser 140 reverses the lower 5 bits and applies the reversed bits to the highest position, or Most Significant Bits (MSBs), of an address selection generator 160. The lookup table 130 feeds an n-bit C-value, based on the inputted lower 5 bits, to a multiplication & modulo operating device 150.

Meanwhile, the upper n bits, or MSBs, output from the input counter 110 are fed to a first adder 120. Here, the upper n bits indicate one of $2^n$ addresses in each group and are used as a variable for permuting data bits of the group. The first adder 120 adds 1 to the received upper n bits and applies the sum to the multiplication & modulo operating device 150. The multiplication & modulo operating device 150 subjects the input n bits and the initial n-bit seed C of each group to multiplication and modulo addition, and then feeds the result to the address selection generator 160. Modulo addition refers to retaining the lower n bits of the sum resulting from multiplying the output of the adder 120 by the output of the look-up table 130. The address selection generator 160 forms an address in which the output of the bit reverser 140 is the upper 5 bits, MSBs, and the output of the multiplication & modulo operating device 150 is the lower n bits, LSBs, for turbo interleaving. If the address formed is larger than or equal to the turbo interleaver address size, the address selection generator 160 discards the address. That is, the address selective generator 160 outputs the address only if it is smaller than the turbo interleaver address size. The output address is provided as an address for the interleaver memory shown in FIG. 1.

Since many of addresses output from the address generator shown in FIG. 2 are punctured, addresses are discontinuously generated. As a result, hardware complexity increases when configuring a real system.

The discontinuous generation of addresses makes regular addressing impossible, which implies that the clock timing of a turbo decoder cannot be kept constant in a real hardware implementation because the synchronization of the turbo decoder is based on the symbol clock signal or addressing clock signal of the interleaver.

SUMMARY OF THE INVENTION

It is, therefore, an object of the present invention to provide an address generator and an address generating method in a radio communications system, which generate an address every predetermined period for turbo interleaving/deinterleaving.

It is another object of the present invention to provide an address generator and an address generating method in a radio communications system, which keeps the clock timing of a turbo decoder constant.

It is a further object of the present invention to provide an address generator and an address generating method in a radio communications system, which removes the hardware complexity in implementing a turbo decoder.

These and other objects are achieved by providing an address generator and an address generating method. According to one aspect of the present invention, the address generator generates available addresses, which are fewer than $2^{k+n}$ and are divided into $2^k$ groups each having $2^n$ position addresses, without puncturing the addresses of unavailable groups and the unavailable addresses of partially unavailable groups. In the address generator, a first counter counts a plurality of clock pulses, generates a first group count value consisting of k bits and indicating one of the $2^k$ groups at each clock pulse, and generates a carry after counting $2^k$ clock pulses. A second counter receives the carry from the first counter, counts the plurality of carries, and generates a first position count value consisting of n bits and indicating one of the $2^n$ position addresses. A controller stores second group count values representing the unavailable groups, third group count values representing the groups having both available and unavailable position addresses, and second position count values representing the unavailable position addresses. If the first group count value is one of the second group count values, or the first group count value is one of the third group count values and the first position count value is one of the second position count values, the controller directs the first and second counters not to output the first group count value and the first position count value. A bit reverser receives the k bits from the first counter and reverses the k bits. An operating device receives the first group count value and the first position count value, subjects the received count values to $C*(j+1)$ modulo $2^n$ (C is an initial seed value corresponding to the first group count value and j is the first position count value), and generates the result i. A buffer stores the available address formed out of the reversed bits received from the bit reverser and the bits i received from the operating device.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

The present inventor found out that unavailable addresses are generated in accordance with a certain rule. As stated above, unavailable addresses are addresses larger than or equal to the turbo interleaver size (or input frame length) and, thus, must be discarded. The rule will be described later. In the preferred embodiment of the present invention, the source values from which unavailable addresses are generated are skipped beforehand, utilizing the regularity among unavailable addresses. As a result, available addresses for turbo interleaving/deinterleaving are generated continuously, for every predetermined period, so that problems caused by the discontinuous generation of addresses are overcome.

Figure 3:
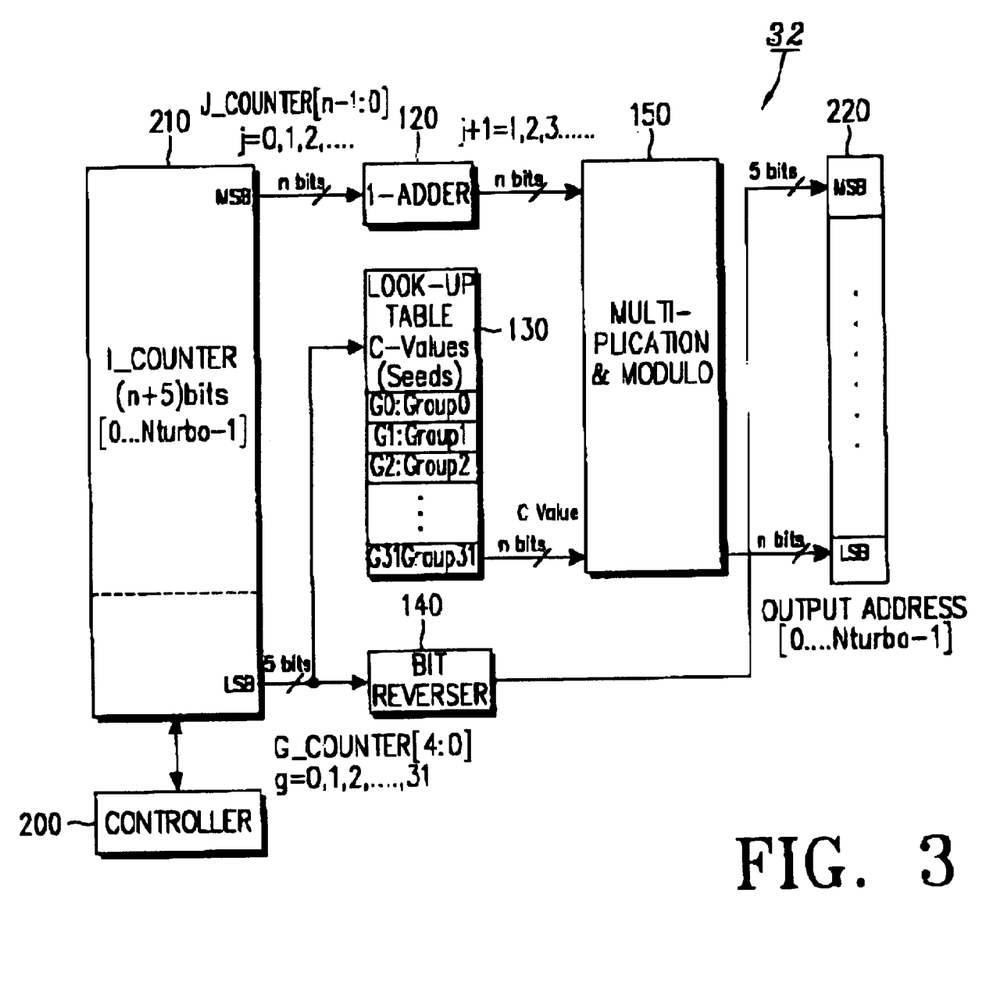
FIG. 3 is a block diagram of a turbo interleaving address generator according to the preferred embodiment of the present invention.

In accordance with the preferred embodiment of the present invention, an address generator for turbo interleaving is configured as shown in FIG. 3 to generate only available addresses during each predetermined period. Since turbo einterleaving is the reverse operation of turbo interleaving, the present invention is applicable to a turbo deinterleaver as well as to a turbo interleaver. Therefore, it is obvious that while the preferred embodiment of the present invention is described in the context of a turbo interleaver, it can be applied to a turbo deinterleaver. In addition, the following description is conducted with the appreciation that the number of interleaving groups is $2^5$ (=32) by way of example, but it can be any number $2^k$, as will be described later below.

FIG. 3 is a block diagram of an address generator according to the preferred embodiment of the present invention.

Referring to FIG. 3, the address generator of the preferred embodiment includes a controller 200, an input counter (I_COUNTER) 210, and address generating units 120 to 150 for randomizing input addresses and generating turbo interleaving addresses out of the randomized addresses. The adder 120, the look-up table 130, the bit reverser 140, and the multiplication & modulo operating device 150 are typical components as observed in the conventional address generator shown in FIG. 2. The other components, the controller 200 and the counter 210 are characteristic of the preferred embodiment of the present invention.

The controller 200 converts a predetermined turbo interleaver size value (input frame length). $N_{turbo}$ to a corresponding binary number and determines what addresses to discard among the addresses possibly generated by analyzing the binary number. Here, addresses larger than or equal to $N_{turbo}$ are selected to be discarded. The input counter 210 outputs address bits for use in generating the other addresses continuously under the control of the controller 200.

Specifically, the controller 200 needs to analyze the upper 5 bits, MSBs, (first threshold) of the final binary number address, representative of the number of interleaving block groups, to determine which addresses having the upper 5 bits greater than the first threshold, and to discard them. However, when the final binary number address is output from the output address buffer 220, it is already too late to ensure that the output address is an available one. Therefore, in the preferred embodiment of the present invention, the controller analyzes the lower 5 bit, LSBs, to be output from the input counter 210, because these 5 LSBs, once reversed in the bit reverser 140, become the 5 MSBs of the final output address. In this manner, the controller can eliminate unavailable addresses before they are created. The input counter 210, under the control of the controller 200, only outputs source bits that will generate available addresses.

When the input counter 210 is about to generate source bits (the 5 LSBs) which will generate an output address with the 5 MSBs equal to the first threshold, the controller 200 directs the input counter 210 based on the remaining source bits to be generated, namely, the n MSBs to be output form the input counter 210. In terms of the final output address, when it has the upper 5 bits equal to the first threshold, it will be discarded if the complete address (=upper 5 bits and the lower n bits) is greater than or equal to $N_{turbo}$. On the other hand, if the complete final output address (=upper 5 bits and the lower n bits) is smaller than $N_{turbo}$, the complete address can be used. Therefore, the determination about what addresses to selectively generate or discard depends on the lower n bits (second threshold) of the binary number. In terms of the output of the input counter 210, this means the controller 200 must direct the input counter 210 to produce only upper n, MSB, source bits which will end up generating lower n, LSB, output bits that are smaller than the second threshold.

The input counter 210 outputs no count values, or source bits, which will generate output addresses larger than or equal to $N_{turbo}$ under the control of the controller 200, as stated above. As compared to the counter 110 in the prior art which outputs count values [0 . . . $2^{n+5}$–1], including count values which will generate addresses larger than or equal to $N_{turbo}$ and thus will need to be discarded, the input counter 210 outputs count values [0 . . . $N_{turbo}$–1] which will generate only addresses smaller than $N_{turbo}$. The manner in which the controller 200 determines which addresses to be discarded and the counting operation of the input counter 210 will be clearly understood in a description below with reference to the tables.

In FIG. 3, the randomizing block, including the adder 120, the look-up table 130, the bit reverser 140, and the multiplication & modulo operating device 150, randomizes the input address sequence counted (or output) by the input counter 210. In the following description, the source bits output by the input counter 210 will be referred to as the input address, while the final bits input to the output address buffer 220 will be referred to as the output address. The adder 120 adds a specific value "1" to the upper n bits of the input address. Assuming that the received upper n-bit value, j=0, 1, 2, . . . , the adder 120 outputs j+1=1, 2, 3, . . . . The look-up table 130 stores a plurality of seeds (or C-values) corresponding to the respective groups and outputs an n-bit seed value corresponding to the group represented by the lower 5 bits of the input address. The multiplication & modulo operating device 150 subjects the outputs of the adder 120 and the look-up table 130 to multiplication & modulo addition and outputs the result as the lower n bits, LSBs, of the output address for turbo interleaving. The multiplication & modulo addition output is the sum of the outputs of the adder 120 and the look-up table 130 with the lower n bits truncated. If the n-bit seed value corresponding to the lower 5 bits of the input address is C and the upper n bits of the input address is j, the multiplication & modulo operating device 150 outputs i (=C*(j+1) modulo $2^n$) according to an LCS reversion formula. The bit reverser 140 reverses the lower 5 bits received from the input counter 210 and outputs the reversed bits as the upper 5 bits of the output address. The outputs of the bit reverser 140 and the multiplication & modulo operating device 150 form the upper 5 bits and lower n bits of the output address, respectively. Then, the output address is stored in the buffer 220 and provided as a read address to the interleaver memory 36 of FIG. 1.

When the address generator shown in FIG. 3 is applied to a turbo interleaver, a (5+n)-bit output address is fed as a read address to the interleaver memory 36 at an output side of the turbo interleaver. With the address generator is applied to a turbo deinterleaver, the (5+n)-bit output address is provided as a write address to the deinterleaver memory.

Figure 4:
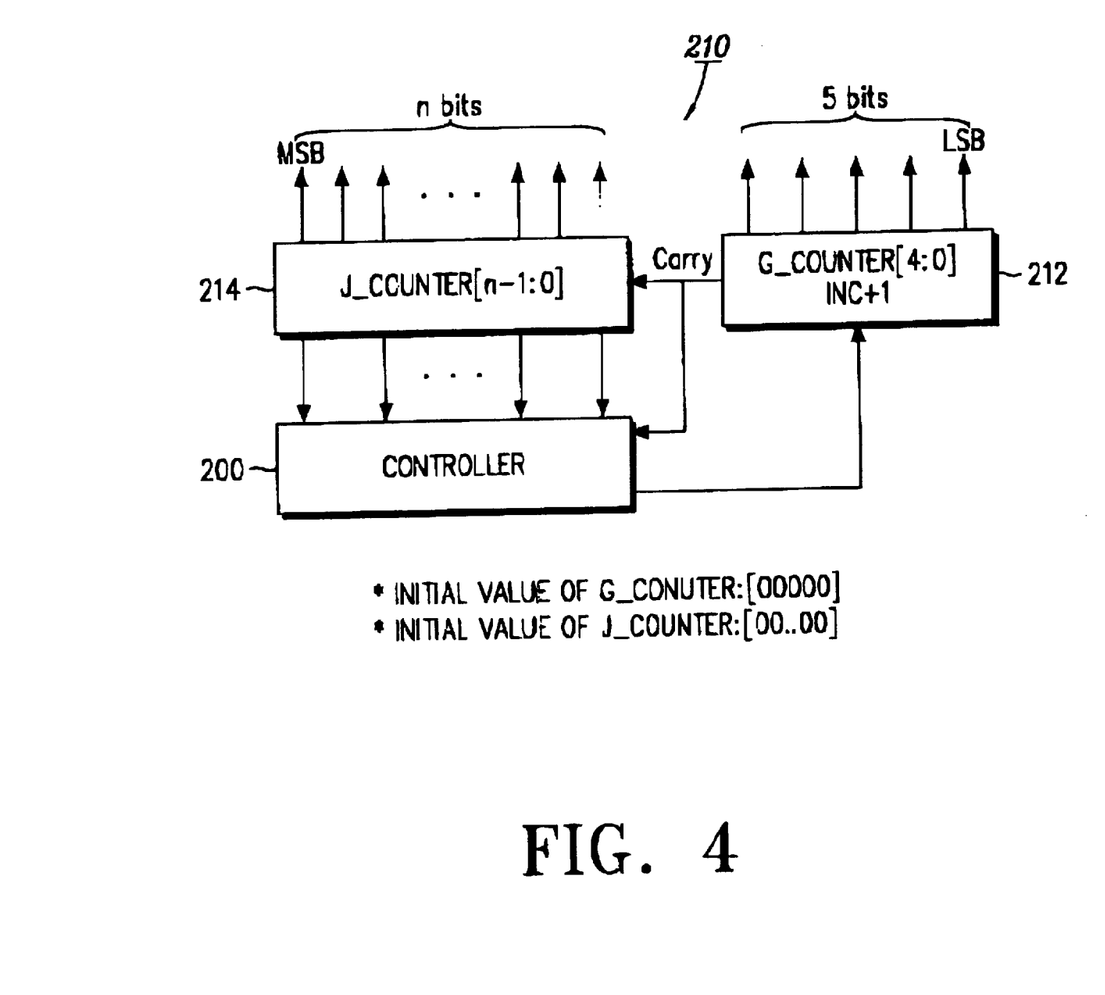
FIG. 4 is a detailed block diagram of an input counter shown in FIG. 3, according to the preferred embodiment of the present invention.

FIG. 4 is a detailed block diagram of the input counter 210 shown in FIG. 3.

Referring to FIG. 4, the input counter 210 is comprised of a group counter (G_COUNTER) 212 for counting the lower 5 bits [4:0] of the input address and an index counter (J_COUNTER) 214 for counting the upper n bits [n–1:0] of the input address. The counters 212 and 214 count a plurality of symbol clock pulses as shown in FIG. 1 and generate a 5-bit value and an n-bit value, respectively, at each clock pulse. The lower 5 bits output from the group counter 212 indicate one of $2^5$ groups in an interleaving block determined by the interleaver size and are fed to the look-up table 130 and the bit reverser 140. The upper n bits output from the index counter 214 indicate one of $2^n$ addresses for each group. Here, each address is used as a variable to permute data bits in a corresponding group. A carry generated by the counting of group counter 212 is applied to the index counter 214 and the controller 200. Upon receipt of the carry, the controller 200 checks the count of the index counter 214 and selectively increments the count of the group counter 212. That is, the group counter 212 skips a corresponding value and counts the next value at a specific time under the control of the controller 200, while sequentially counting up beginning with [00000]. An initial value for the group counter 212 is [00000] and an initial value for the index counter 214 is [00 . . . 00].

The group counter 212 is a lower counter for counting the lower 5 bits of the input address, which lower 5 bits determine the upper 5 bits of the output address, and the index counter 214 is an upper counter for counting the upper n bits of the input address, which upper n bits determine the lower n bits of the output address. According to the preferred embodiment of the present invention, the input counter 210 generates an (n+5)-bit input address out of which an output address is generated according to the turbo interleaver size, without ever generating an input address out of which the resulting output address must be discarded.

With $2^5$ (=32) groups given according to an interleaver size and $2^n$ position addresses within each group, the address generator shown in FIGS. 3 and 4 generates available addresses, which are fewer than $2^{5+n}$.

The address generator of the present invention is also applicable to the general case where an interleaving block has $2^k$ groups, and each group includes $2^n$ addresses. In this case, available addresses, which are fewer than $2^{k+n}$, are generated. The address generator is characterized in that it generates available addresses without the need for puncturing the addresses of unavailable groups or the addresses of groups in which some position addresses are unavailable.

For this purpose, the group counter 212 in the address generator counts a plurality of clock pulses. At each clock pulse, the group counter 212 generates a first group count value, which consists of k bits and indicates one of the $2^k$ groups, and then generates a carry value after counting $2^k$ clock pulses. The index counter 214 counts the plurality of carries from the group counter 212, and generates a first position count value, which consists of n bits and indicates one of the $2^n$ addresses in the group, at each clock pulse. The controller 200 stores second group count values indicating the unavailable groups, third group count values indicating groups which have both available and unavailable position addresses, and second position count values indicating the unavailable position addresses. If the first group count value is one of the second group count values, or if the first group count value is one of the third group count values and the first position count value is one of the second position count values, the controller 200 directs the group counter 212 and the index counter 214 so that the first group count value and the first position count value will not be output. The bit reverser 140 reverses bits of the first group count value, consisting of k bits. The reversed k bits are stored in an output buffer 220 and used as the upper k bits, MSBs, of an output address. An operation block including the adder 120, the look-up table 130, and the multiplication & modulo operating device 150 receives the first group count value and the first position count value, creates an initial seed value C corresponding to the first group count value, and then generates a result i using the LCS reversion formula C*j+1) modulo $2^n$ (j is the first position count value). The result i is stored in the buffer 220 and used as the lower n bits LSBs of an output address for turbo interleaving/deinterleaving.

Analysis shows that the sequence of discarded addresses follows a rule. Using this rule, the controller 200 directs the input counter 210 to count no values out of which addresses which must be discarded can be generated, thereby overcoming the discontinuous generation of output addresses. The following description is conducted in the context of an LCS turbo interleaver employed in IS-95C, that is, in the context of a current 1× turbo CODEC which supports two data rates RS1 and RS2.

Analysis of Turbo Interleaver Size

TABLE 1

| RS | $N_{turbo}$ (=L) | n | M = $2^n$ | $L_{(2)}$ | first threshold | second threshold |
|---|---|---|---|---|---|---|
| 1 | 378 | 4 | 16 | 10111 1010 | 10111 | 10 |
| 2 | 570 | 5 | 32 | 10001 11010 | 10001 | 26 |
| 1 | 762 | 5 | 32 | 10111 11010 | 10111 | 26 |
| 2 | 1146 | 6 | 64 | 10001 111010 | 10001 | 58 |
| 1 | 1530 | 6 | 64 | 10111 111010 | 10111 | 58 |
| 2 | 2298 | 7 | 128 | 10001 1111010 | 10001 | 122 |
| 1 | 3066 | | | 10111 1111010 | 10111 | |
| 2 | 4602 | 8 | 256 | 10001 11111010 | 10001 | |
| 1 | 6138 | | | 10111 11111010 | 10111 | |

In Table 1, $N_{turbo}$ (=L) is a real turbo interleaver size (input frame data size) and n is the number of bits of each position address within each group, as determined according to $N_{turbo}$, that is, a value for permuting data bits in each group. For example, if $N_{turbo}$ is 378, the number of addresses is 512 (=$2^9$) according to the IS-95C specification. This means that each complete output address will have 9 bits. Thus, the number of addresses in each group is $2^4$ because $2^5$ (=32) groups are given in an interleaving block according to the IS-95C standard. So there are 5 bits in each group address, and 4 bits in each position address within a group. M is the LCS period, $2^n$. $N_{turbo(2)}$ or $L_{(2)}$ is the turbo interleaver size value expressed in a binary number. The "first threshold" indicates the upper 5 bits of $L_{(2)}$; and the "second threshold" indicates the lower n bits of $L_{(2)}$ (thus excluding the upper 5 bits), expressed as a decimal number. Any complete address with a group address larger than the first threshold is an unavailable address. Any complete address with a group address equal to the first threshold and a position address greater than or equal to the second threshold is an unavailable address.

Referring to Table 1, $L_{(2)}$ has the same upper 5 bits or first threshold, "10111" at RS1 and "10001" at RS2, regardless of $N_{turbo}$. At RS1, an output address with the upper 5 bits greater than "10111" is to be discarded. At RS2, an output address with the upper 5 bits greater than "10001" is to be discarded. Therefore, the discontinuous generation of output addresses can be prevented by controlling the input counter 210 to not output an input address whose lower 5 bits will generate the upper 5 bits of an output address that must be discarded. Since the upper 5 bits, 5 MSBs, of the output address are the reversed bits of the lower 5 bits, 5 LSBs, counted (or output) by the input counter 210, the input counter 210 is directed to generate only input addresses in which the lower 5 bits, once reversed, are not greater than the upper 5-bit threshold. The threshold of the upper 5 bits, which is first threshold="10111" at RS1 and first threshold= "10001" at RS2, is reversed to "11101" and "10001", respectively. Hence, the controller 200 controls the input counter to output an input address whose lower 5 bits, once reversed, are greater than the first threshold, in order that available output addresses are continuously generated.

Determination of Addresses to be Discarded

Table 2 and Table 3 list count values of the group counter 212 corresponding to addresses to be discarded among the output addresses determined according to a turbo interleaver size at RS1 and RS2, respectively.

TABLE 2

| ADDRESS_<br>OUT [8:4]<br>= first threshold | G_<br>COUNTER [4:0] | RESULT | number of discarded<br>ADDRESS_OUT |
|---|---|---|---|
| 10111 | 11101 (29) | partially discarded | <$2^n$ |
| 11000 | 00011 (3) | all discarded | $2^n$ |
| 11001 | 10011 (19) | all discarded | $2^n$ |
| 11010 | 01011 (11) | all discarded | $2^n$ |
| 11011 | 11011 (27) | all discarded | $2^n$ |
| 11100 | 00111 (7) | all discarded | $2^n$ |
| 11101 | 10111 (23) | all discarded | $2^n$ |
| 11110 | 01111 (15) | all discarded | $2^n$ |
| 11111 | 11111 (31) | all discarded | $2^n$ |

Referring to Table 2, output addresses can be categorized into three types (only two of which are shown in Table 2) according to the values of their upper 5 bits at RS1. Output addresses are generated if their 5 MSBs (ADDRESS_OUT [n+k−1:n] or ADDRESS_OUT[8:5]) are in the range of 00000(=0)–10110(=22), discarded if they are in the range of 11000(=24)–11111(=31), and discarded or generated according to their lower n bits if they are 10111(=23=first threshold). The 5 MSBs, or ADDRESS_OUT[8:4], of the output address correspond to the 5 LSBs, or G_COUNTER [4:0]=G_COUNTER[k−1:0], of the input address.

As derived from Table 2, the set of input addresses which will generate unavailable output addresses are shown in Equation (1) below. More exactly, the decimal equivalent of the input address source bits (or G_COUNTER) for the group address portion of the unavailable output addresses are arranged in ascending order as an arithmetic sequence with an initial term of 3 and an arithmetic difference of 4.

Discarded G_COUNTER[4:0]{3, 7, 11, 15, 19, 23, 27, 31}  (1)

If the input counter 210 outputs no count values, or input addresses, with G_COUNTER satisfying Eq. 1, each output address will be smaller than $N_{turbo}$. In order for this to occur, the input counter 210 is designed to generate no indexes or input addresses corresponding with unavailable addresses. Since the above sequence forms an arithmetic sequence with an arithmetic difference of 4, real input addresses I_COUNTER [n+4:0] are regularly generated. That is, the group counter 212 just outputs the following decimal equivalents:

$$G\_RS1=\{0, 1, 2, 4, 5, 6, 8, 9, 10, 12, 13, 14, 16, 17, 18, 20, 21, 22, 24, 25, 26, 28, 29, 30\} \qquad (2)$$

Only the group addresses corresponding to count values included in the group shown in Eq. 2 are used as the group address portion of output addresses for an LCS turbo interleaver. Here, the same G_COUNTER sequence is used to generate available output addresses at RS1 regardless of turbo interleaver sizes. That is, the group counter 212 simply generates binary equivalents of the decimals shown in Eq. 2 at RS1 regardless of n.

However, if the upper 5 bits of an output address is 10111(23) (ADDRESS_out [8:4]=(10111)), that is, if the lower 5 bits of the input address is G_COUNTER [4:0]= (11101), the output address can be selectively discarded. The parameters used to determine which addresses to discard are J_COUNTER[n−1:0] and C.

TABLE 3

| ADDRESS_OUT [8:4] | G_COUNTER [4:0] | RESULT | number of discarded ADDRESS_OUT |
|---|---|---|---|
| 10001 | 10001 (17) | partially discarded | $<2^n$ |
| 10010 | 01001 (9) | all discarded | $2^n$ |
| 10011 | 11001 (25) | all discarded | $2^n$ |
| 10100 | 00101 (5) | all discarded | $2^n$ |
| 10101 | 10101 (21) | all discarded | $2^n$ |
| 10110 | 01101 (13) | all discarded | $2^n$ |
| 10111 | 11101 (29) | all discarded | $2^n$ |
| 11000 | 00011 (3) | all discarded | $2^n$ |
| 11001 | 10011 (19) | all discarded | $2^n$ |
| 11010 | 01011 (11) | all discarded | $2^n$ |
| 11011 | 11011 (27) | all discarded | $2^n$ |
| 11100 | 00111 (7) | all discarded | $2^n$ |
| 11101 | 10111 (23) | all discarded | $2^n$ |
| 11110 | 01111 (15) | all discarded | $2^n$ |
| 11111 | 11111 (31) | all discarded | $2^n$ |

Referrring to Table 3, output addresses are also categorized into three types according to the values of their upper 5 bits at RS2. Output addresses ADDRESS_OUT[n+k−1:0] are generated if the group address portions ADDRESS_OUT[n+k−1:n] of the output addresses are in the range of 00000(0)–10000(16), discarded if they are in the range of 10010(18)–11111(31), and discarded or generated according to their lower n bits if they are 10001(17).

As derived from Table 3, the lower 5 bits of input addresses which will generate unavailable output addresses are arranged in ascending order as an arithmetic sequence with an initial term of 3 and an arithmetic difference of 2.

$$\text{Discarded } G\_COUNTER[4:0]=\{3, 5, 7, 9, 11, 13, 15, 17, 19, 21, 23, 25, 27, 29\ 31\} \qquad (3)$$

If the input counter 210 outputs no count values with G_COUNTER satisfying Eq. 3, each output address will be smaller than $N_{turbo}$. This suggests that the input counter 210 should be designed to generate no input addresses related to unavailable output addresses. Since the above sequence forms an arithmetic sequence with an arithmetic difference of 2, real input addresses I_COUNTER [n+4:0] are regularly generated. That is, the group counter 212 just outputs the binary equivalents of the decimal values shown in Eq. 4.

$$G\_RS2=\{0, 1, 2, 4, 6, 8, 10\ 12, 14, 16, 17, 18, 20, 22, 24, 26, 28, 30\} \qquad (4)$$

Only addresses corresponding to count values included in the group shown in Eq. 4 are used as output addresses for an LCS turbo interleaver. Here, the same G_COUNTER sequence is used to generate available output addresses at RS2 regardless of the turbo interleaver size. That is, the group counter 212 simply generates the binary equivalents of the decimal values shown in Eq. 4 at RS2 regardless of n.

However, if the upper 5 bits of an output address is 10001(17) (ADDRESS_OUT[8:4]=(10001)), that is, the lower 5 bits of an input address is G_COUNTER[4:0]= (10001), the output address can be selectively discarded. The parameters used to determine to discard an address are J_COUNTER[n−1:0] and C.

Output addresses can be generated at every symbol interval by designing the group counter 212 and controller 200 to output the group counter 212 bits, the lower 5 bits of an input address, satisfying Eq. 2 or Eq. 4, as stated above. In the cases of ADDRESS_OUT[8:4]=(10111), that is, G_COUNTER[4:0]29 at RS1, and ADDRESS_OUT[8:4]= (10001), that is, G_COUNTER[4:0]=17 at RS2, an additional procedure should be performed.

Table 4 and Table 5 show the relationship between n and C among LCS turbo interleaver parameters in IS-95C. In the tables, underlined portions represent groups having discarded addresses and bold portions represent groups having discarded and generated addresses. With respect to the underlined groups, the input counter 210 implements no counting operation. On the other hand, the input counter 210 counts values for the bold groups. Consequently, all interleaved addresses can be generated without puncturing at an output terminal of an LCS turbo interleaver by controlling the input counter 210 with respect to the two types of groups.

Table 4 shows the relationship between n and C at RS1. As noted from the tables, the in put counter 210 is inoperative with respect to groups with table indexes 3, 7, 11, 15, 19, 23, 27, and 31.

Table 5 shows the relationship between n and C at RS2. As noted from the tables, the input counter 210 is inoperative with respect to groups with table indexes 5, 3, 5, 7, 11, 13, 15, 19, 21, 23, 25, 27, 29 and 31.

TABLE 4

| table index | n = 4 entries | n = 5 entries | n = 6 entries | n = 7 entries | n = 8 entries | n = 9 entries | n = 10 entries |
|---|---|---|---|---|---|---|---|
| 0 | 5 | 27 | 3 | 15 | 3 | 3 | 1 |
| 1 | 15 | 3 | 27 | 127 | 1 | 31 | 3 |
| 2 | 5 | 1 | 15 | 89 | 5 | 9 | 927 |
| <u>3</u> | <u>15</u> | <u>15</u> | <u>13</u> | <u>1</u> | <u>83</u> | <u>355</u> | <u>1</u> |
| 4 | 1 | 13 | 29 | 31 | 19 | 203 | 3 |
| 5 | 9 | 17 | 5 | 15 | 179 | 407 | 1 |
| 6 | 9 | 23 | 1 | 61 | 19 | 257 | 1 |
| <u>7</u> | <u>15</u> | <u>13</u> | <u>31</u> | <u>47</u> | <u>99</u> | <u>1</u> | <u>589</u> |
| 8 | 13 | 9 | 3 | 127 | 23 | 3 | 937 |
| 9 | 15 | 3 | 9 | 17 | 1 | 1 | 375 |
| 10 | 7 | 15 | 15 | 119 | 3 | 503 | 615 |
| <u>11</u> | <u>11</u> | <u>3</u> | <u>31</u> | <u>15</u> | <u>13</u> | <u>1</u> | <u>1</u> |
| 12 | 15 | 13 | 17 | 57 | 13 | 3 | 737 |
| 13 | 3 | 1 | 5 | 123 | 3 | 395 | 1 |
| 14 | 15 | 13 | 39 | 95 | 17 | 1 | 3 |

TABLE 4-continued

| table index | n = 4 entries | n = 5 entries | n = 6 entries | n = 7 entries | n = 8 entries | n = 9 entries | n = 10 entries |
|---|---|---|---|---|---|---|---|
| 15 | 5 | 29 | 1 | 5 | 1 | 415 | 85 |
| 16 | 13 | 21 | 19 | 85 | 63 | 199 | 981 |
| 17 | 15 | 19 | 27 | 17 | 131 | 111 | 329 |
| 18 | 9 | 1 | 15 | 55 | 17 | 219 | 109 |
| 19 | 3 | 3 | 13 | 57 | 131 | 495 | 949 |
| 20 | 1 | 29 | 45 | 15 | 211 | 93 | 167 |
| 21 | 3 | 17 | 5 | 41 | 173 | 239 | 589 |
| 22 | 15 | 25 | 33 | 93 | 231 | 111 | 675 |
| 23 | 1 | 29 | 15 | 87 | 171 | 131 | 297 |
| 24 | 13 | 9 | 13 | 63 | 23 | 383 | 879 |
| 25 | 1 | 13 | 9 | 15 | 147 | 209 | 109 |
| 26 | 9 | 23 | 15 | 13 | 243 | 355 | 161 |
| 27 | 15 | 13 | 31 | 15 | 213 | 407 | 187 |
| 28 | 11 | 13 | 17 | 81 | 189 | 171 | 999 |
| 29 | 3 | 1 | 5 | 57 | 51 | 111 | 727 |
| 30 | 15 | 13 | 15 | 31 | 15 | 363 | 67 |
| 31 | 5 | 13 | 33 | 69 | 67 | 105 | 875 |

TABLE 5

| table index | n = 4 entries | n = 5 entries | n = 6 entries | n = 7 entries | n = 8 entries | n = 9 entries | n = 10 entries |
|---|---|---|---|---|---|---|---|
| 0 | 5 | 27 | 3 | 15 | 3 | 3 | 1 |
| 1 | 15 | 3 | 27 | 127 | 1 | 31 | 3 |
| 2 | 5 | 1 | 15 | 89 | 5 | 9 | 927 |
| 3 | 15 | 15 | 13 | 1 | 83 | 355 | 1 |
| 4 | 1 | 13 | 29 | 31 | 19 | 203 | 3 |
| 5 | 9 | 17 | 5 | 15 | 179 | 407 | 1 |
| 6 | 9 | 23 | 1 | 61 | 19 | 257 | 1 |
| 7 | 15 | 13 | 31 | 47 | 99 | 1 | 589 |
| 8 | 13 | 9 | 3 | 127 | 23 | 3 | 937 |
| 9 | 15 | 3 | 9 | 17 | 1 | 1 | 375 |
| 10 | 7 | 15 | 15 | 119 | 3 | 503 | 615 |
| 11 | 11 | 3 | 31 | 15 | 13 | 1 | 1 |
| 12 | 15 | 13 | 17 | 57 | 13 | 3 | 737 |
| 13 | 3 | 1 | 5 | 123 | 3 | 395 | 1 |
| 14 | 15 | 13 | 39 | 95 | 17 | 1 | 3 |
| 15 | 5 | 29 | 1 | 5 | 1 | 415 | 85 |
| 16 | 13 | 21 | 19 | 85 | 63 | 199 | 981 |
| 17 | 15 | 19 | 27 | 17 | 131 | 111 | 329 |
| 18 | 9 | 1 | 15 | 55 | 17 | 219 | 109 |
| 19 | 3 | 3 | 13 | 57 | 131 | 495 | 949 |
| 20 | 1 | 29 | 45 | 15 | 211 | 93 | 167 |
| 21 | 3 | 17 | 5 | 41 | 173 | 239 | 589 |
| 22 | 15 | 25 | 33 | 93 | 231 | 111 | 675 |
| 23 | 1 | 29 | 15 | 87 | 171 | 131 | 297 |
| 24 | 13 | 9 | 13 | 63 | 23 | 383 | 879 |
| 25 | 1 | 13 | 9 | 15 | 147 | 209 | 109 |
| 26 | 9 | 23 | 15 | 13 | 243 | 355 | 161 |
| 27 | 15 | 13 | 31 | 15 | 213 | 407 | 187 |
| 28 | 11 | 13 | 17 | 81 | 189 | 171 | 999 |
| 29 | 3 | 1 | 5 | 57 | 51 | 111 | 727 |
| 30 | 15 | 13 | 15 | 31 | 15 | 363 | 67 |
| 31 | 5 | 13 | 33 | 69 | 67 | 105 | 875 |

Determination of Addresses to be Selectively Discarded

Now, there will be given a description of selective discard or generation of adresses having the upper 5 bits equal to the upper 5 bits of a turbo interleaver size expressed in a binary number. Addresses which belong to group 29 in Table 4 or group 17 in Table 5 are selectively generated or discarded by controlling the index counter 214.

Referring to Table 6 and Table 7, whether to generate or discard addresses with upper 5 bits equal to the upper 5 bits of the turbo interleaver size is determined according to the second threshold, that is, the lower n bits of the turbo interleaver size. The index counter 214 is controlled to generate no input address with upper n bits corresponding to lower n bits of an output address larger than or equal to the second threshold. For example, if the second threshold is 10 as shown in Table 6, output addresses with the lower n bits larger than or equal to 10 (ADDRESS_OUT[n−1:0]={10, 11, 12, 13, 14, 15}) are supposed to be discarded. Therefore, the input counter 210 should not generate input addresses with upper n bits corresponding to the determined lower n bits of output addresses. Upper n bits of an input address out of which the determined lower n bits are generated can be obtained by reversely performing an LCS operation since the lower n bits are generated after LCS operation in the adder 120 and the multiplication & modulo operating device 150. For example, the source upper n bits of input addresses corresponding to output addresses with lower n bits of {10, 11, 12, 13, 14, 15}) are {3, 4, 8, 9, 13, 14}. Therefore, the index counter 214 is controlled not to count J_COUNTER [n−1]={3, 4, 8, 9, 13, 14} corresponding to the determined lower n bits {10, 11, 12, 13, 14, 15}.

TABLE 6

| RS1(G_COUNTER=29) | n = 4 | n = 5 | n = 6 | n = 7 | n = 8 |
|---|---|---|---|---|---|
| C | 3 | 1 | 5 | 57 | 51 |
| Second threshold | 10 | 26 | 58 | 122 | 250 |
| ADDRESS_OUT[n−1:0] :discarded index | {10, 11, 12, 13, 14, 15} | {26, 27, 28, 29, 30, 31} | {58, 59, 60, 61, 62, 63} | {122, 123, 124, 125, 126, 127} | {250, 251, 252, 253, 254, 255} |
| J_COUNTER[n−1:0] :discarded index | {3, 4, 8, 9, 13, 14} | {25, 26, 27, 28, 29, 30} | {11, 24, 37, 49, 50, 62} | {73, 82, 91, 100, 109, 118} | {4, 9, 14, 19, 24, 29} |

TABLE 7

| RS2(G_COUNTER=17) | n = 5 | n = 6 | n = 7 | n = 8 |
|---|---|---|---|---|
| C | 19 | 27 | 17 | 131 |
| Second threshold | 26 | 58 | 122 | 250 |
| ADDRESS_OUT[n−1:0] :discarded index | {26, 27, 28, 29, 30, 31} | {58, 59, 60, 61, 62, 63} | {122, 123, 124, 125, 126, 127} | {250, 251, 252, 253, 254, 255} |
| J_COUNTER[n−1:0] :discarded index | {4, 9, 14, 19, 24, 29} | {6, 13, 25, 32, 44, 51} | {14, 29, 44, 59, 74, 89} | {40, 83, 126, 169, 212, 253} |

Table 6 lists addresses with upper 5 bits equal to 10111 and lower n bits larger than or equal to the second threshold and thus to be discarded at RS1. For example, if $N_{turbo}$ is 378, the first threshold is 10111(=29), and the second threshold is 1010(=10) as shown in Table 1, addresses with 10111 as upper 5 bits are discarded if they have lower n bits {10, 11, 12, 13, 14, 15} larger than or equal to the second threshold. Therefore, the index counter 214 generates no input addresses with n upper bits {3, 4, 8, 9, 13, 14} corresponding to {10, 11, 12, 13, 14, 15} through a reverse LCS operation under the control of the controller 200. Since no input addresses which generate unavailable output addresses are generated, the input counter 210 counts input addresses for generating only available addresses continuously.

Table 7 lists addresses with upper 5 bits equal to 10001 and lower n bits not smaller than the second threshold and thus to be discarded at RS2. For example, if $N_{turbo}$ is 570, the first threshold is 10001(17), and the second threshold is 11010(26) as shown in Table 1, addresses with 10001 as upper 5 bits are discarded if they have lower n bits {26, 27, 28, 29, 30, 31} larger than or equal to the second threshold. Therefore, the index counter 214 generates no input addresses with n upper bits {4, 9, 14, 19, 24, 29} corresponding to {26, 27, 28, 29, 30, 31} through a reverse LCS operation under the control of the controller 200. Since no input addresses which generate unavailable output addresses are generated, the input counter 210 counts input adresses for generating only available addresses continuously.

Table 8 lists addresses under the conditions of RS1, G_COUNTER[4:0]=29, n=4, C=3, and the second threshold=10. In Table 8, ADDRESS_OUT[8:4]=10111 (23) is a reversed value of G_COUNTER—[4:0]=11101 (29). Hence, addresses with upper 5 bits 10111, if they satisfy J_COUNTER[3:0]ϵ{3, 4, 8, 9, 10 13, 14}, are discarded, as shown in Table 6. In the case that J_COUNTER[3:0] ϵ {3, 4, 8, 9, 13, 14}, G_COUNTER is incremented by 1, indicating the next group. Therefore, I_COUNTER[n+4:0] transits to group 30 without outputting an index corresponding to group 29.

TABLE 8

| J_COUNTER [3:0] | LCS | ADDRESS_ OUT[3:0] | ADDRESS_ OUT[8:4] |
| --- | --- | --- | --- |
| 0 | (0 + 1) × 3 mod 16 | 3 | 10111 (23) |
| 1 | (1 + 1) × 3 mod 16 | 6 | 10111 (23) |
| 2 | (2 + 1) × 3 mod 16 | 9 | 10111 (23) |
| 3 | (3 + 1) × 3 mod 16 | 12 * discarded | 10111 (23) |
| 4 | (4 + 1) × 3 mod 16 | 15 * discarded | 10111 (23) |
| 5 | (5 + 1) × 3 mod 16 | 2 | 10111 (23) |
| 6 | (6 + 1) × 3 mod 16 | 5 | 10111 (23) |
| 7 | (7 + 1) × 3 mod 16 | 8 | 10111 (23) |
| 8 | (8 + 1) × 3 mod 16 | 11 * discarded | 10111 (23) |
| 9 | (9 + 1) × 3 mod 16 | 14 * discarded | 10111 (23) |
| 10 | (10 + 1) × 3 mod 16 | 1 | 10111 (23) |
| 11 | (11 + 1) × 3 mod 16 | 4 | 10111 (23) |
| 12 | (12 + 1) × 3 mod 16 | 7 | 10111 (23) |
| 13 | (13 + 1) × 3 mod 16 | 10 * discarded | 10111 (23) |
| 14 | (14 + 1) × 3 mod 16 | 13 * discarded | 10111 (23) |
| 15 | (15 + 1) × 3 mod 16 | 0 | 10111 (23) |

Table 9 lists addresses under the conditions of RS1, G_COUNTER[4:0]=29, n=5, C=1, and the second threshold =26. In Table 9, ADDRESS_OUT[8:4]=10111(23) is a reversed value of G_COUNTER_[4:0]=11101(29). Hence, addresses with upper 5 bits 10111, if they satisfy J_COUNTER[3:0]ϵ{25, 26, 27, 28, 29, 30} are discarded, as shown in Table 6. In the case that J_COUNTER[3:0] ϵ {3, 4, 8, 9, 13, 14}, G_COUNTER is incremented by 1, indicating the next group. Therefore, I_COUNTER[n+4:0] transits to group 30 without outputting an index corresponding to group 29.

TABLE 9

| J_COUNTER [3:0] | LCS | ADDRESS_ OUT[4:0] | ADDRESS_ OUT[8:4] |
| --- | --- | --- | --- |
| 0 | (0 + 1) × 3 mod 32 | 1 | 10111 (23) |
| 1 | (1 + 1) × 3 mod 32 | 2 | 10111 (23) |
| 2 | (2 + 1) × 3 mod 32 | 3 | 10111 (23) |
| 3 | (3 + 1) × 3 mod 32 | 4 | 10111 (23) |
| 4 | (4 + 1) × 3 mod 32 | 5 | 10111 (23) |
| 5 | (5 + 1) × 3 mod 32 | 6 | 10111 (23) |
| 6 | (6 + 1) × 3 mod 32 | 7 | 10111 (23) |
| 7 | (7 + 1) × 3 mod 32 | 8 | 10111 (23) |
| 8 | (8 + 1) × 3 mod 32 | 9 | 10111 (23) |
| 9 | (9 + 1) × 3 mod 32 | 10 | 10111 (23) |
| 10 | (10 + 1) × 3 mod 32 | 11 | 10111 (23) |
| 11 | (11 x 1) × 3 mod 32 | 12 | 10111 (23) |
| 12 | (12 + 1) × 3 mod 32 | 13 | 10111 (23) |
| 13 | (13 + 1) × 3 mod 32 | 14 | 10111 (23) |
| 14 | (14 + 1) × 3 mod 32 | 15 | 10111 (23) |
| 15 | (15 + 1) × 3 mod 32 | 16 | 10111 (23) |
| 16 | (16 + 1) × 3 mod 32 | 17 | 10111 (23) |
| 17 | (17 + 1) × 3 mod 32 | 18 | 10111 (23) |
| 18 | (18 + 1) × 3 mod 32 | 19 | 10111 (23) |
| 19 | (19 + 1) × 3 mod 32 | 20 | 10111 (23) |

TABLE 9-continued

| J_COUNTER [3:0] | LCS | ADDRESS_ OUT[4:0] | ADDRESS_ OUT[8:4] |
| --- | --- | --- | --- |
| 20 | (20 + 1) × 3 mod 32 | 21 | 10111 (23) |
| 21 | (21 + 1) × 3 mod 32 | 22 | 10111 (23) |
| 22 | (22 + 1) × 3 mod 32 | 23 | 10111 (23) |
| 23 | (23 + 1) × 3 mod 32 | 24 | 10111 (23) |
| 24 | (24 + 1) × 3 mod 32 | 25 | 10111 (23) |
| 25 | (25 + 1) × 3 mod 32 | 26 * discarded | 10111 (23) |
| 26 | (26 + 1) × 3 mod 32 | 27 * discarded | 10111 (23) |
| 27 | (27 + 1) × 3 mod 32 | 28 * discarded | 10111 (23) |
| 28 | (28 + 1) × 3 mod 32 | 29 * discarded | 10111 (23) |
| 29 | (29 + 1) × 3 mod 32 | 30 * discarded | 10111 (23) |
| 30 | (30 + 1) × 3 mod 32 | 31 * discarded | 10111 (23) |
| 31 | (31 + 1) × 3 mod 32 | 16 | 10111 (23) |

Address Generating Procedure

Figure 5:
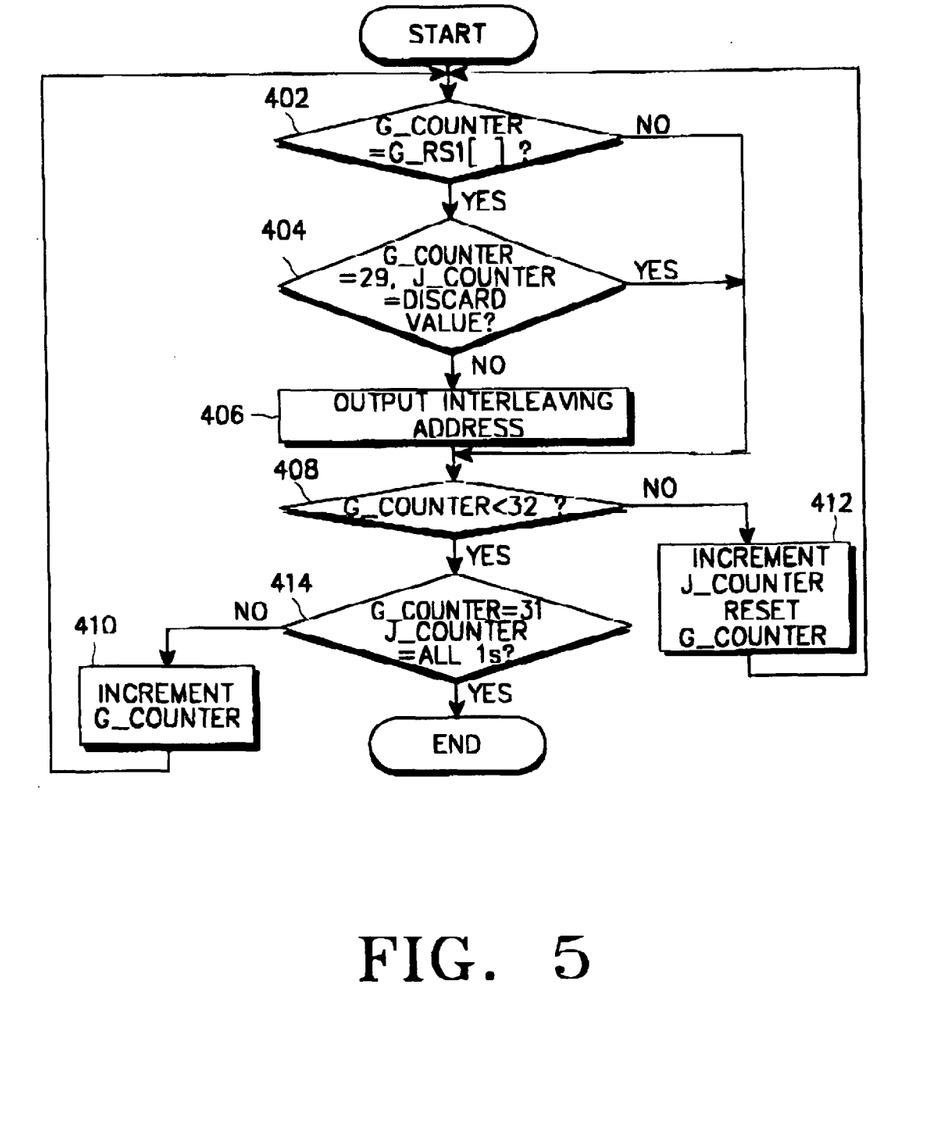
FIG. 5 is a flowchart illustrating an embodiment of an address generating method according to the preferred embodiment of the present invention.
Figure 6:
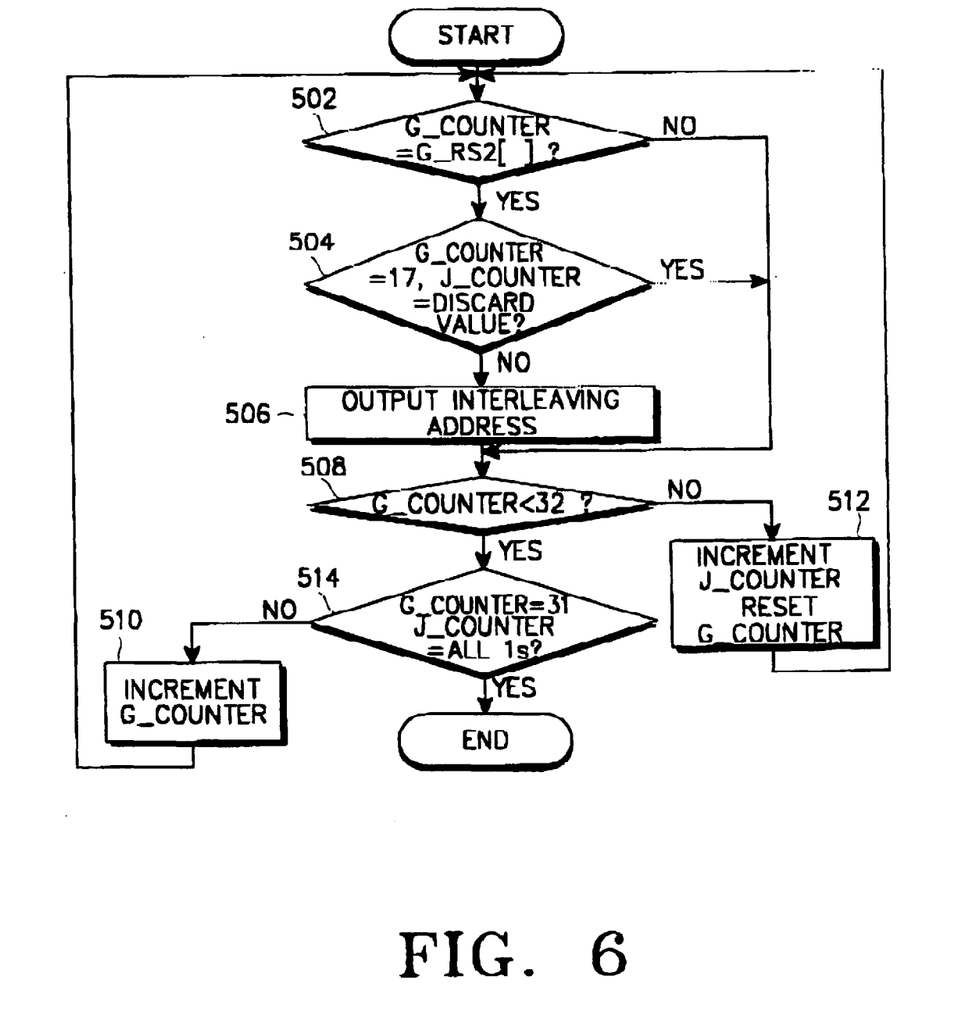
FIG. 6 is a flowchart illustrating another embodiment of the address generating method according to the preferred embodiment of the present invention.

FIGS. 5 and 6 are flowcharts illustrating first and second embodiments of an address generating method at RS1 and at RS2, respectively, according to the present invention. This procedure is controlled by the controller 200. In an initial state, the group counter 212 and the index counter 214 are reset.

Referring to FIG. 5, the controller 200 first determines in step 402 whether the count value of the group counter (G_COUNTER) 212 is included in the G_RS1 sequence {0,1,2,4,5,6,8,9,10,12,13,14,16,17,18,20,21,22,24,25,26,28, 29,30} shown in Eq. 2. In the following example, the group counter is initialized to zero. When the count value of the group counter 212 corresponds to "00000(=0)", i.e., one of the values in the G_RS1 sequence, in step 402, it is determined in step 404 whether the count value of the group counter 212 is 29 and the count value of the index counter 214 corresponds to any one of the unavailable address values (e.g., {3,4,8,9,13,14}). In this case, G_COUNTER equals "00000(=0)", and not "11101(=29), so the controller 200 outputs an interleaving address by bit reversing and randomizing the count value "00000(=0)" of the group counter 212 and the count value "000 . . . 000(=0)" of the index counter (J_COUNTER) 214, in step 406. Since the count value "00000(=0)" of the group counter 212 is smaller than 32 (step 408) and not equal to 31 (step 414), the group counter 212 outputs the incremented next count value "00001(=1)" at step 410.

Now that the group count value is "00001(=1)", the operation of steps 402, 404, 406, 408, 414 and 410, is repeated in the same manner as has been performed on the count value "00000(=0)" as shown above. Further, after "00001(=1)" has been incremented to "00010(=2)", the operation of steps 402, 404, 406, 408, 414 and 410 is performed on count value "00010(=2)" in the same manner.

However, when the count value of the group counter 212 reaches "00011(=3)", the following operation will be performed. In step 402, it is determined that the count value of the group counter 212 does not correspond to G_RS1={0, 1,2,4,5,6,8,9,10,12,13,14,16,17,18,20,21,22,24,25,26,28,29, 30} shown in Eq. 2, i.e., corresponds to {3,7,11,15,19,23, 27,31} shown in Eq. 1. Since the group count value does not equal one of the values in G_RS1, the controller 200 directly proceeds to step 408, thereby passing (i.e., skipping) steps 404 and 406. In other words, when the group counter 212 counts one of the values {3,7,11,15,19,23,27,31} shown in Eq. 1, the controller 200 does not output the corresponding count value as an interleaving address. When the count value of the group counter 212 is equal to one of the other values {7,11,15,19,23,27,31} shown in Eq. 1, the same operation will be performed as in the case of the count value of "00011(=3)" of the group counter 212.

As described above, after increasing the count value of the group counter 212 in step 410, it is determined in step 402 whether the count value corresponds to one of the values in the G_RS1 sequence shown in Eq. 2. If so, step 404 is performed, and then step 406 is performed to output an interleaving address. If not so, the process skips to step 408, and neither step 404 nor 406 is performed, resulting in no interleaving address being output. These operations are performed on all the available count values (0–31) of the group counter 212. As the group counter 212 counts through all the values (0–31), the count value of the index counter 214 is fixed to a specific value. For example, an initial count value of the index counter 214 is fixed to "000 . . . 000(=0)", during the period that the count values of the group counter 212 are incremented to output the count values corresponding to the G_RS1 sequence shown in Eq. 2 as interleaving addresses.

Meanwhile, after all the countable values (0–31) of the group counter 212 are counted, the group counter 212 generates a carry. The determination whether or not the carry is generated by the group counter 212, i.e., whether the count value of the group counter 212 is greater than or equal to 32, is determined by the controller 200 in step 408. If it is determined in step 408 that the carry is generated by the group counter 212, the controller 200 resets the group counter 212 and the index counter 214 increments the index count value, in step 412. The steps 402, 404, 406, 408, 414 and 410 are repeatedly performed on the incremented index count value of the index counter 214. Accordingly, while increasing the count values of the group counter 212 for the incremented count value of the index counter 214, the count values corresponding to the G_RS1 sequence shown in Eq. 2 are output as interleaving addresses.

While performing such address generating operation, if it is determined in step 404 that the count value of the group counter 212 is 29 and the count value of the index counter 214 is any one of the invalid index values (e.g., {3,4,8,9,13,14} shown in Table 6) corresponding to unavailable position address values, the procedure skips step 406 and directly proceeds to step 408 in order that an input address corresponding to an unavailable output address is not generated. That is, if the group counter 212 reaches 29 when the count value of the index counter 214 corresponds to one of the unavailable position address values, step 406 is skipped in order to avoid outputting the corresponding count value as an interleaving address.

The above-stated operation is performed repeatedly until it is determined in step 414 that the count value of the group counter 212 is "11111(=31)" and the count value of the index counter 214 is all ones, "111 . . . 111".

Referring to FIG. 6, the controller 200 first determines in step 502 whether the count value of the group counter (G_COUNTER) 212 corresponds to G_RS2 sequence {0,1,2,4,6,8,10,12,14,16,17,18,20,22,24,26,28,29,30} shown in Eq. 4. In the following example, the group counter is initialized to zero. When the count value of the group counter 212 corresponds to "00000(=0)", i.e., one of the values in the G_RS2 sequence, in step 502, it is determined in step 504 whether the count value of the group counter is 17 and the count value of the index counter 214 corresponds to any one of the unavailable position values. In this case G_Counter equals "00000(=0)", and not "10001(=17)", so the controller 200 outputs an interleaving address by bit reversing and randomizing the count value "00000(0)" of the group counter 212 and the count value "000 . . . 000(0)" of the index counter (J_COUNTER) 214, in step 506. Since the count value "00000(0)" of the group counter 212 is smaller than 32 (step 508) and not equal to 31 (step 514), the group counter 212 outputs an incremented next count value "00001(1)" in step 510.

Now that the group count value is "00001(=1)", the operation of steps 502, 504, 506, 508, 514 and 510, is repeated in the same manner as has been performed on the count value "00000(=0)" as shown above. Further, after (00001(=1)" has been incremented to "00010(=2)", the operation of steps 502, 504, 506, 508, 514 and 510 is performed on count value "00010(=2)" in the same manner.

However, when the count value of the group counter 212 is "00011(3)", the following operation will be performed. In step 502, it is determined that the count value of the group counter 212 does not correspond to G_RS2={0,1,2,4,6,8,10,12,14, 16,17,18,20,22,24,26,28,29,30} shown in Eq. 4, i.e., corresponds to {3,5,7,9,11,13,15,19,21,23,25,27,29,31} shown in Eq. 3. Since the group count value does not equal one of the values in G_RS2, the controller 200 directly proceeds to step 508, thereby passing (i.e., skipping) steps 504 and 506. In other words, when the group counter 212 counts one of the values {3,5,7,9,11,13,15,19,21,23,25,27,29,31} shown in Eq. 3, the controller 200 does not output the corresponding count value as an interleaving address. When the count value of the group counter 212 is equal to one of the values {3,5,7,9,11,13,15,19,21,23,25,27,29,31} shown in Eq. 3, the same operation will be performed as in the case of the count value "00011(=3)" of the group counter 212.

As described above, while increasing the count value of the group counter 212 in step 510, it is determined in step 502 whether the group count value is one of the values in the G_RS2 sequence shown in Eq. 4. If so, step 504 is performed, and then step 506 is performed to output an interleaving address. If not so, the process skips to step 508, and neither step 504 nor 506 is performed, so no interleaving address is output. These operations are performed on all the available count values (0–31) of the group counter 212. As the group counter 212 counts through all the values (0–31), the index count value of the index counter 214 is fixed to a specific value. For example, an initial index count value of the index counter 214 is fixed to "000 . . . 000(0)", during the period that the count values of the group counter 212 are incremented to output the count values corresponding to the G_RS2 sequence shown in Eq. 4 as interleaving addresses.

Meanwhile, after all the countable values (0–31) of the group counter 212 are counted, the group counter 212 generates a carry. The determination whether or not the carry is generated by the group counter 212, i.e., whether the count value of the group counter 212 is greater than or equal to 32, is made by the controller 200 in step 508. If it is determined in step 508 that the carry is generated by the group counter 212, the controller 200 resets the group counter 212 and the index counter 214 counts the increased count value, in step 512. The steps 502, 504, 506, 508, 514 and 510 are performed repeatedly on each incremented index count value of the index counter 214. Accordingly, while incrementing the group count of the group counter 212 for each incremented index count of the index counter 214, the count values corresponding to the G_RS2 sequence shown in Eq. 4 are output as interleaving addresses.

While performing these address generating operations, if it is determined in step 504 that the count value of the group counter 212 is 17 and the count value of the index counter 214 is any one of invalid index values (e.g., {4,9,14,19,24,29} shown in Table 7) corresponding to unavailable position addresses, the procedure skips step 506 and directly proceeds to step 508 in order that an input address corresponding to an unavailable output address is not generated. That is, when the group counter 212 counts 17 in a state where the count value of the index counter 214 is one of the removing values, the step 506 is skipped so as not to output the corresponding count value as an interleaving address.

The above-stated operation is performed repeatedly until it is determined in step 514 that the count value of the group counter 212 is "11111(=31)" and the count value of the index counter 214 is all ones "111 . . . 111".

Figure 7:
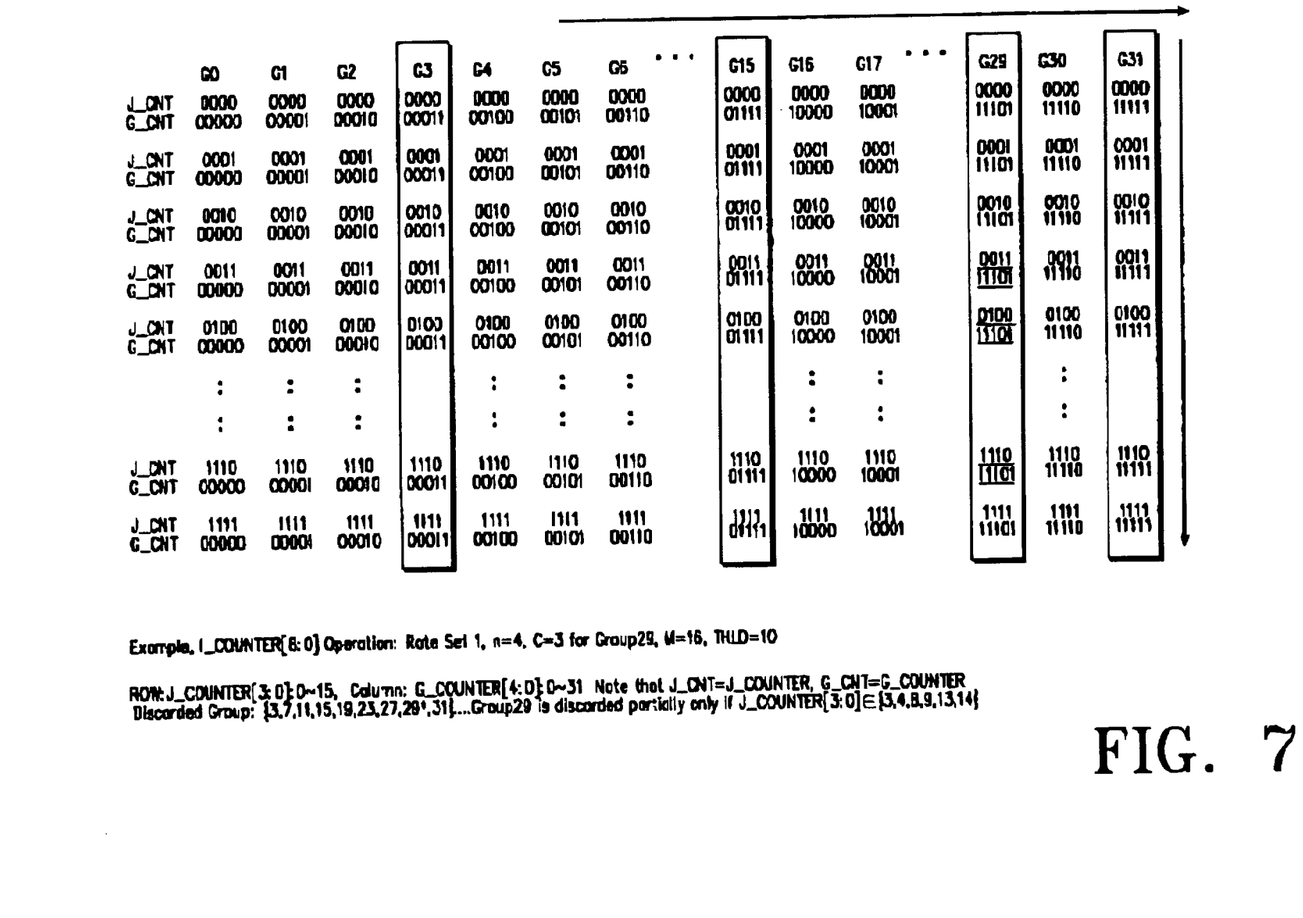
FIG. 7 illustrates an example of a counting operation in the input counter shown in FIG. 4, according to the preferred embodiment of the present invention.

FIG. 7 illustrates an example of a counting operation in the input counter 210 shown in FIG. 4. Here, the input counter 210 performs a [8:0] count operation under the conditions that the data rate is RS1, a turbo interleaver size is 378, $2^5$ groups are given in an interleaving block according to the turbo interleaver size, each group has $2^4$ addresses, $M(2^n)$ is 16, and second threshold is 10.

In FIG. 7, G_CNT and J_CNT denote the count values of the group counter 212 and the index counter 214, respectively. The group counter 212 is a 5-bit binary counter which counts from 0 to 31 (=0000-1111) and generates the group count value. The index counter 214 is a 4-bit binary counter which counts from 0 to 15(=0000-1111) and generates the position count value. The counters 212 and 214 generate addresses smaller than the interleaver size as available addresses under the control of the controller 200. If the group counter 212 counts values indicating one of discarded groups {3, 7, 11, 15, 19, 23, 27, 31}, the controller 200 controls the group counter 212 to count values indicating the next group without outputting the count value. That is, the controller 200 controls the group counter 212 to generate group count values without the count values of the discarded groups, as in the following series: G0(00000)→G1(00001) →G2(00010)→G4(00100)→G5(00101)→G6(00110)→ . . . →G6(10000)→G17(10001)→ . . . →G30(11110).

Meanwhile, the controller 200 selectively generates addresses in a group equal to the interleaver size as available addresses. If the group counter 212 counts group 29 equal to the interleaver size and the index counter 214 generates a position count value included in {3, 4, 8, 9, 13, 14}, which means that the resulting output address would be unavailable, the controller 200 controls the index counter 214 to generate the next count value without outputting the current count value. That is, when the count value of the group counter 212 is 29, the controller 200 controls the index counter 214 to generate all the count values except for {3, 4, 8, 9, 13, 14}.

How to determine discarded groups and positions has been described, with the discarded groups shown in Eq. 2 and Table 4, and the discarded positions shown in Tables 6 and 8.

As described above, the present invention ensures that no input addresses corresponding to unavailable output addresses are generated, thereby generating turbo interleaving/deinterleaving addresses at each predetermined interval, using a certain rule which holds among discarded addresses. Therefore, clock timing is kept constant for the turbo decoder and the hardware complexity in implementing the turbo decoder is considerably diminished.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An address generator for generating available addresses, said available addresses being fewer than $2^{k+n}$ complete addresses, said complete addresses being divided into $2^k$ groups each having $2^n$ position addresses, without generating unavailable complete addresses, the address generator comprising:

a first counter for counting a plurality of clock pulses, for generating a group count consisting of k bits indicating one of the $2^k$ groups at each clock pulse, and for generating a carry after counting $2^k$ clock pulses;

a second counter for receiving the carry from the first counter, for counting the carry, and for generating a position count consisting of n bits indicating one of the $2^n$ position addresses;

a controller for storing unavailable group count values representing the unavailable groups, partially unavailable group count values representing the groups having both available and unavailable position addresses, and unavailable position count values representing the unavailable position addresses, and for controlling the first and second counters not to output the group count and the position count if the group count is one of the unavailable group count values, or the group count is one of the partially unavailable group count values and the position count is one of the unavailable position count values;

a bit reverser for receiving and reversing the k bits from the first counter;

an operating device for receiving the group count and the position count, for determining an initial seed value corresponding to the received group count, for determining result bits based on the equation:

(initial seed value)*(position count+1) modulo $2^n$; and a buffer for storing an available address formed out of the reversed bits received from the bit reverser and the result bits received from the operating device.

2. A method of generating available addresses, said available addresses being fewer than $2^{k+n}$ complete addresses which are divided into $2^k$ groups each having $2^n$ position addresses, without generating unavailable complete addresses, the method comprising the steps of:

counting a plurality of clock pulses, generating a group count at each clock pulse, said group count consisting of k bits indicating one of the $2^k$ groups;

generating a carry after the group count counts $2^k$ clock pulses;

receiving the carry, counting the carry, and generating a position count at each clock pulse, said position count consisting of n bits indicating one of the $2^n$ addresses;

controlling the group count and the position count not to be output if the group count is one of unavailable group count values representative of the unavailable groups, or the group count is one of partially unavailable group count values representative of the groups having both available and unavailable position addresses and the position count is one of unavailable position count values representative of the unavailable position addresses;

determining an initial seed value corresponding to the group count;

determining result bits based on the equation:

result bits=(initial seed value)*(position count+1) modulo $2^n$;

reversing the k bits from the first counter; and generating an available address formed out of the reversed bits and the result bits.

3. An address generator for generating available addresses, said available addresses being fewer than $2^{k+n}$ complete addresses which are divided into $2^k$ groups each having $2^n$ position addresses, without generating unavailable addresses, the address generator comprising:

a (k+n)-bit binary counter comprising:
- a k-bit binary counter for counting a plurality of clock pulses, for generating a group count consisting of k bits, said group count indicating one of the $2^k$ groups at each clock pulse, and for generating a carry after counting $2^k$ clock pulses, and
- an n-bit binary counter for receiving the carry from the k-bit binary counter and for generating a position count j of n bits indicating one of $2^n$ addresses in a group;

a controller for storing unavailable group count values representing the unavailable groups, partially unavailable group count values representing the groups having both available and unavailable position addresses, and unavailable position count values representing the unavailable position addresses, and for controlling the (k+n)-bit binary counter not to output the group count and the position count if the group count is one of the unavailable group count values, or the group count is one of the partially unavailable group count values and the position count is one of the unavailable position count values;

a bit reverser for receiving and reversing the k bits from the k-bit binary counter; and an operating device for receiving the group count and the position count, for determining a seed value corresponding to the received group count, and generating result bits based on the equation:

result bits=(initial seed value)*(position count+1) modulo $2^n$;

wherein an available address is formed out of the reversed bits from the bit reverser and the result bits from the operating device.

4. A method of generating available addresses, said available addresses being fewer than $2^{k+n}$ complete addresses, said complete addresses being divided into $2^k$ groups each having $2^n$ position addresses, using an address generator having a (k+n)-bit binary counter for providing a group count consisting of k bits indicating one of the $2^k$ groups and a position count consisting of n bits indicating one of $2^n$ addresses in each group, a bit reverser for reversing the k bits of the group count, and an operating device for receiving the group count and the position count, determining a seed value, and generating result bits using the equation: (initial seed value)*(position count+1) modulo $2^n$, the method comprising the steps of:

generating the group count at each clock pulse;
generating a carry after the group count counts $2^k$ clock pulses;
receiving the carry and generating the position count at each clock pulse; and
controlling the group count and the position count not to be output if the group count is one of unavailable group count values representative of unavailable groups, or the group count is one of partially unavailable group count values representative of groups having both available and unavailable position addresses and the position count is one of unavailable position count values representative of unavailable position addresses, wherein an available address is formed out of the reversed bits from the bit reverser and the result bits from the operating device.

5. An address generator for generating a read/write address for a turbo interleaver/deinterleaver memory, comprising:

a first counter for counting a first sequence representative of one of groups in an interleaving block, determined according to a predetermined interleaver size, and for outputting a first count every clock pulse;

a second counter for counting a second sequence representative of one of position addresses in each group, and for outputting a second count every clock pulse;

a controller for expressing the interleaver/deinterleaver size as a binary number, for setting upper bits of the binary number as a first threshold, said first threshold corresponding to the last available group, for setting the remaining bits of the binary number as a second threshold, said second threshold corresponding to a first unavailable position address within the last available group, for controlling the first counter not to output a first count if the first count, once reversed, is greater than the first threshold, and for controlling the second counter not to output the second count if both the second count, once transformed by the LCS operation, is greater than or equal to the second threshold and the first count, once reversed, is equal to the first threshold;

a bit reverser for reversing the first count and for outputting the reversed bits as the upper bits of the read/write address; and an operating device for performing an LCS (Linear Congruential Sequence) operation on the first and second count, and for outputting the operated bits as the lower bits of the read/write address.

6. The address generator of claim 5, wherein the controller controls the first counter to output the next group in the interleaving block if the value of first count, once reversed, is a value greater than the first threshold.

7. The address generator of claim 5, wherein the controller controls the second counter to output the next position address if both the first count is the reversed value of the first threshold and the second count, once transformed by the LCS operation, is greater than or equal to the second threshold.

8. The address generator of claim 7, wherein the controller determines whether the second count, once transformed by the LCS operation, is greater than or equal to the second threshold by comparing the second count with count values obtained by performing said LCS operation in a reverse manner on the first and econd threshold and position addresses greater than the second threshold.

9. The address generator of claim 5, wherein the first counter counts the first count to represent one of 32 groups of an interleaving block.

10. An address generating method in an address generator, said address generator producing an output read/write address for a turbo interleaver/deinterleaver memory, said output read/write address consisting of upper and lower bits, said upper bits being an output of a bit reverser and said lower bits being an output of an operating device which performs an LCS reversion formula, the method comprising the steps of:

expressing a predetermined interleaver size in a binary number;
setting upper bits of the binary number to a first threshold;
setting other bits of the binary number to a second threshold;

counting a first count representative of one of address groups in an interleaving block, which is determined according to the interleaver size;

outputting the first count;

counting a second count representative of one of position addresses in each group;

outputting the second count;

controlling the first count not to be output if the first count, once transformed by the bit reverser, is greater than the first threshold;

comparing a result of performing an LCS reversion formula on the first and second count with the second threshold if the first count, once transformed by the bit reverser, is equal to the first threshold;

controlling the second count not to be output if the result of performing the LCS formula on the first and second count is equal to the second threshold;

providing the output first count to the bit reverser and the operating device; and providing the output second count to the operating device; and generating an output read/write address.

11. The method of claim 10, further comprising the step of:

controlling the first count to indicate the next group in the interleaving block if the first count is the reversed value of a value greater than the first threshold.

12. The method of claim 10, further comprising the step of:

controlling the second count to indicate the next data bit position if both the result of performing an LCS reversion formula on the first and second count is larger than or equal to the second threshold and the first count, once reversed, is equal to the first threshold.

* * * * *